(12) United States Patent
Cartmell

(10) Patent No.: US 7,912,111 B2
(45) Date of Patent: Mar. 22, 2011

(54) DYNAMIC SWITCHING OF CARRIER TRACKING LOOPS WITHOUT LOSS OF TRACKING INFORMATION

(75) Inventor: Andrew Peter John Cartmell, Palo Alto, CA (US)

(73) Assignee: Trimble Navigation Ltd, Sunnyvale, CA (US)

( * ) Notice: Subject to any disclaimer, the term of this patent is extended or adjusted under 35 U.S.C. 154(b) by 938 days.

(21) Appl. No.: 11/323,426

(22) Filed: Dec. 29, 2005

(65) Prior Publication Data

US 2007/0153880 A1    Jul. 5, 2007

(51) Int. Cl.
*H04B 1/69*     (2006.01)
*H04L 27/12*    (2006.01)
*H04L 27/22*    (2006.01)

(52) U.S. Cl. .......................... 375/137; 375/326; 375/344
(58) Field of Classification Search .................. 375/137, 375/145, 326, 327, 344, 376; 329/307, 308; 455/208, 209, 260, 265
See application file for complete search history.

(56) References Cited

U.S. PATENT DOCUMENTS

| | | | | |
|---|---|---|---|---|
| 4,079,329 A * | 3/1978 | England et al. | ............... | 329/309 |
| 4,450,585 A | 5/1984 | Bell | | |
| 5,223,843 A | 6/1993 | Hutchinson | | |
| 5,918,161 A * | 6/1999 | Kumar et al. | ................... | 455/65 |
| 6,125,135 A * | 9/2000 | Woo et al. | ...................... | 375/130 |
| 6,154,170 A * | 11/2000 | Dentinger et al. | ........ | 342/357.36 |
| 6,313,789 B1 * | 11/2001 | Zhodzishsky et al. | ... | 342/357.12 |
| 6,633,814 B2 | 10/2003 | Kohli et al. | | |
| 6,744,404 B1 * | 6/2004 | Whitehead et al. | ....... | 342/357.12 |
| 6,850,558 B1 * | 2/2005 | Eerola et al. | ................... | 375/150 |
| 7,738,537 B2 * | 6/2010 | Fenton | ........................... | 375/150 |
| 2001/0020216 A1 * | 9/2001 | Lin | ............................... | 701/216 |
| 2003/0058927 A1 * | 3/2003 | Douglas et al. | ............... | 375/147 |

* cited by examiner

*Primary Examiner* — Young T. Tse

(74) *Attorney, Agent, or Firm* — Boris G. Tankhileyich

(57) ABSTRACT

A method of dynamic switching of a plurality of carrier loops in a radio receiver. The method comprises: (A) receiving a radio signal from a radio source by using a carrier tracking loop; (B) substantially continuously estimating a signal-to-noise ratio (SNR) of the received radio signal from the radio source; (C) if the signal-to-noise ratio (SNR) of the received radio signal from the radio source is above an initial predetermined threshold, performing carrier tracking of the received carrier signal by an initial carrier tracking loop having an initial accumulation period; and (D) if the signal-to-noise ratio (SNR) of the received radio signal from the radio source falls below the initial predetermined threshold; switching from the initial carrier tracking loop having the initial accumulation period to a subsequent carrier tracking loop having a subsequent accumulation period.

14 Claims, 2 Drawing Sheets

DYNAMIC SWITCHING OF CARRIER TRACKING LOOPS WITHOUT LOSS OF TRACKING INFORMATION

BACKGROUND OF THE INVENTION

1. Field of the Invention

The present invention is in the field of signal carrier tracking, and more specifically, is directed to dynamic switching of carrier tracking loops without loss of tracking information.

2. Discussion of the Prior Art

A mechanical fastener (for example, MS9880) is intended for use in the construction market. A unit is mounted on a mast on each end of a 'dozer blade. Using Real Time Kinematic (RTK), the position of the 'dozer and the attitude of the blade can be determined. This information is used to update the operator on required levelling needed based on maps of the construction site.

Although the 'dozer itself does not move quickly, the 'dozer blade sees significant, short period dynamic activity as it hits buried rocks or is used to scrape areas. A mechanical fastener (for example, MS9880) mounted on a mast on the ends of the 'dozer blade also experiences significant dynamics, some of which are amplified by the flexing of the mast itself. More specifically, accelerometers mounted on a MS980 unit during development estimated shock pulses in excess of 300 gm/s$^2$ during operation. The accelerations where of short duration and hence significant jerk terms were also present.

The conventional tracking methods originally designed for static receivers performed unreliably with the dynamics present.

What is needed is new tracking techniques that would perform reliably with the dynamics present.

SUMMARY OF THE INVENTION

The present invention discloses a radio receiver including a plurality of carrier tracking loops, and a method of dynamic switching of the plurality of carrier tracking loops to optimize the receiver's performance in a situation when dynamics is present.

One aspect of the present invention is directed to a method of dynamic switching of a plurality of carrier loops in a radio receiver. Each channel comprises a plurality of carrier tracking loops. Each carrier tracking loop is configured to track a radio source. Each carrier tracking loop has a predetermined accumulation period.

In one embodiment, the method of the present invention comprises the following steps of: (A) receiving a radio signal from a radio source by using a carrier tracking loop; (B) substantially continuously estimating a signal-to-noise ratio (SNR) of the received radio signal from the radio source; (C) if the signal-to-noise ratio (SNR) of the received radio signal from the radio source is above an initial predetermined threshold, performing carrier tracking of the received carrier signal by an initial carrier tracking loop having an initial accumulation period; and (D) if the signal-to-noise ratio (SNR) of the received radio signal from the radio source falls below the initial predetermined threshold, switching from the initial carrier tracking loop having the initial accumulation period to a subsequent carrier tracking loop having a subsequent accumulation period, and performing carrier tracking of the received carrier signal by the subsequent carrier tracking loop having the subsequent accumulation period. The steps (B-D) are preferably repeated when the dynamics changes.

In one embodiment of the present invention, the step (A) further comprises the step (A1) of tracking the radio source of the received radio signal, wherein the radio source is selected from the group consisting of: {a GPS satellite; a GLONASS satellite; a GALILEO satellite; and a pseudolite}.

In one embodiment of the present invention, the step (B) further comprises the following steps: (B1) substantially continuously estimating the signal-to-noise ratio (SNR) of the received radio signal from the radio source; and (B2) selecting the initial carrier tracking loop having the initial accumulation period based on the estimated SNR.

In one embodiment of the present invention, the step (B2) further comprises the following step: (B2, 1) if the estimated SNR is above a first predetermined threshold, selecting a first carrier tracking loop having a first accumulation period to implement the initial carrier tracking loop having the initial accumulation period.

In one embodiment of the present invention, the step (B2) further comprises the following step: (B2, 2) if the estimated SNR falls below the first predetermined threshold but is above a second predetermined threshold, selecting a second carrier tracking loop having a second accumulation period to implement the initial carrier tracking loop having the initial accumulation period.

In one embodiment of the present invention, the step (B2) further comprises the following step: (B2, 3) if the estimated SNR falls below the second predetermined threshold but is above a third predetermined threshold, selecting a third carrier tracking loop having a third accumulation period to implement the initial carrier tracking loop having the initial accumulation period.

In one embodiment of the present invention, the step (C) further comprises the following steps: (C1) performing a standard quadrature mixing operation of I and Q samples of the received radio signal with I and Q components of a local carrier replica generated by a carrier NCO by using an Image Rejection Mixer to generate I and Q baseband samples; (C2) correlating the I and the Q baseband samples with a local copy of a code signal aligned to the received radio signal by a code tracking loop to generate I and Q correlated signals; (C3) accumulating the I and Q correlated signals over a period of time T; (C4) computing a raw carrier tracking error signal by using the I and Q accumulated signals; (C5) filtering the raw carrier tracking error signal by using a loop filter to obtain a filtered carrier tracking error signal; (C6) inserting a loop delay τ into the filtered carrier tracking error signal to generate a feedback error signal; wherein the loop delay τ represents latency of the carrier tracking loop; and (C7) closing the carrier tracking loop by applying the feedback error to an input of the carrier NCO to control a frequency of the local carrier signal.

In one embodiment of the present invention, the step (C6) of inserting the loop delay into the filtered carrier tracking error further comprises the step: (C6, 1) of controlling the loop delay to be a fixed period to minimize transient noise associated with switching between the plurality of carrier tracking loops within a radio channel.

In one embodiment of the present invention, the step (C6) of inserting the loop delay into the filtered carrier tracking error further comprises the step: (C6, 2) of selecting the loop delay from the group consisting of: {a loop update; an accumulation period of the first tracking loop; an accumulation period of the second tracking loop; and an accumulation period of the third tracking loop}.

In one embodiment of the present invention, the step (D) of switching from the initial carrier tracking loop having the initial accumulation period to the subsequent carrier tracking loop having the subsequent accumulation period further comprises the following steps: (D1) modeling the loop filter as a third order digital filter; wherein a numerator of the third order digital filter contains a memory of the previous carrier tracking errors; and wherein a denominator of the third order digital filter contains a memory of the previous loop outputs used to update the carrier NCO; (D2) estimating the SNR and selecting the subsequent carrier tracking loop based on the estimated SNR; wherein the subsequent carrier tracking loop includes a shortest accumulation period corresponding to the estimated SNR; (D3) checking whether the selected carrier loop is different from a currently used loop; and (D4) if the selected carrier loop is different from the currently used loop, resetting the numerator terms to zero, and setting the denominator terms to be equal to a last value output by the loop filter.

Another aspect of the present invention is directed to an apparatus for dynamic switching of a plurality of carrier loops in a radio receiver.

In one embodiment, the apparatus of the present invention comprises: (A) a means for receiving a radio signal from a radio source; (B) a means for substantially continuously estimating a signal-to-noise ratio (SNR) of the received radio signal from the radio source; (C) a means for performing carrier tracking of the received carrier signal; and (D) a means for switching from the initial carrier tracking loop having the initial accumulation period to a subsequent carrier tracking loop having a subsequent accumulation period.

In one embodiment of the present invention, the means (A) further comprises: (A1) a receiving means configured to receive a radio signal from the radio source.

In one embodiment of the present invention, the means (A1) further comprises: (A1, 1) a receiving means configured to track the radio source of the received radio signal, wherein the radio source is selected from the group consisting of: {a GPS satellite; a GLONASS satellite; a GALILEO satellite; and a pseudolite}.

In one embodiment of the present invention, the means (B) further comprises: (B1) a means for selecting the initial carrier tracking loop having the initial accumulation period based on the estimated SNR.

In one embodiment of the present invention, the means (B1) further comprises: (B1, 1) a means for selecting a first carrier tracking loop having a first accumulation period to implement the initial carrier tracking loop having the initial accumulation period, if the estimated SNR is above a first predetermined threshold.

In one embodiment of the present invention, the means (B1) further comprises: (B1, 2) a means for selecting a second carrier tracking loop having a second accumulation period to implement the initial carrier tracking loop having the initial accumulation period, if the estimated SNR falls below the first predetermined threshold but is above a second predetermined threshold.

In one embodiment of the present invention, the means (B1) further comprises: (B1, 3) a means for selecting a third carrier tracking loop having a third accumulation period to implement the initial carrier tracking loop having the initial accumulation period, if the estimated SNR falls below the second predetermined threshold but is above a third predetermined threshold.

In one embodiment of the present invention, the means (C) further comprises: (C1) an initial carrier tracking loop having an initial accumulation period configured to perform carrier tracking of the received carrier signal.

In one embodiment of the present invention, the means (C) further comprises: (C2) a Phase-Locked Loop configured to align a local carrier signal with the received carrier signal.

In one embodiment of the present invention, the means (C) further comprises: (C3) a means for performing a standard quadrature mixing operation of I and Q samples of the received radio signal with I and Q components of a local carrier replica generated by a carrier NCO to generate I and Q baseband samples; (C4) a means for correlating the I and the Q baseband samples with a local copy of a code signal aligned to the received radio signal to generate I and Q correlated signals; (C5) a means for accumulating the I and Q correlated signals over a period of time T; (C6) a means for computing a raw carrier tracking error signal by using the I and Q accumulated signals; (C7) a means for filtering the raw carrier tracking error signal to obtain a filtered carrier tracking error signal; (C8) a means for inserting a loop delay $\tau$ into the filtered carrier tracking error signal to generate a feedback error signal; wherein the loop delay $\tau$ represents latency of the carrier tracking loop; and (C9) a means for closing the carrier tracking loop by applying the feedback error to an input of the carrier NCO to control a frequency of the local carrier signal.

In one embodiment of the present invention, the means (C3) further comprises: (C3, 1) an Image Rejection Mixer configured to perform a standard quadrature mixing operation of I and Q samples of the received radio signal with I and Q components of a local carrier replica generated by a carrier NCO to generate I and Q baseband samples.

In one embodiment of the present invention, the means (C4) further comprises: (C4, 1) a code tracking loop configured to correlate the I and the Q baseband samples with a local copy of a code signal aligned to the received radio signal by to generate I and Q correlated signals.

In one embodiment of the present invention, the means (C7) further comprises: (C7, 1) a loop filter configured to filter the raw carrier tracking error signal to obtain a filtered carrier tracking error signal.

In one embodiment of the present invention, the means (C8) further comprises: (C8, 1) a means for controlling the loop delay to be a fixed period to minimize transient noise associated with switching between the plurality of carrier tracking loops within a radio channel.

In one embodiment of the present invention, the means (C8) further comprises: (C8, 2) a means for selecting the loop delay from the group consisting of: {a loop update; an accumulation period of the first tracking loop; an accumulation period of the second tracking loop; and an accumulation period of the third tracking loop}.

In one embodiment of the present invention, the means (D) further comprises: (D1) a third order digital filter; wherein a numerator of the third order digital filter contains a memory of the previous carrier tracking errors; and wherein a denominator of the third order digital filter contains a memory of the previous loop outputs used to update the carrier NCO; (D2) a means for estimating the SNR; (D3) a means for selecting the subsequent carrier tracking loop based on the estimated SNR; wherein the subsequent carrier tracking loop includes a shortest accumulation period corresponding to the estimated SNR; and (D4) a means for resetting the numerator terms to zero, and for setting the denominator terms to be equal to a last value output by the loop filter, if the selected carrier loop is different from the currently used loop.

In one embodiment of the present invention, the means (D1) further comprises: (D1, 1) a software program implementing the third order digital filter; wherein a numerator of the third order digital filter contains a memory of the previous carrier tracking errors; and wherein a denominator of the third order digital filter contains a memory of the previous loop outputs used to update the carrier NCO.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be comprised within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
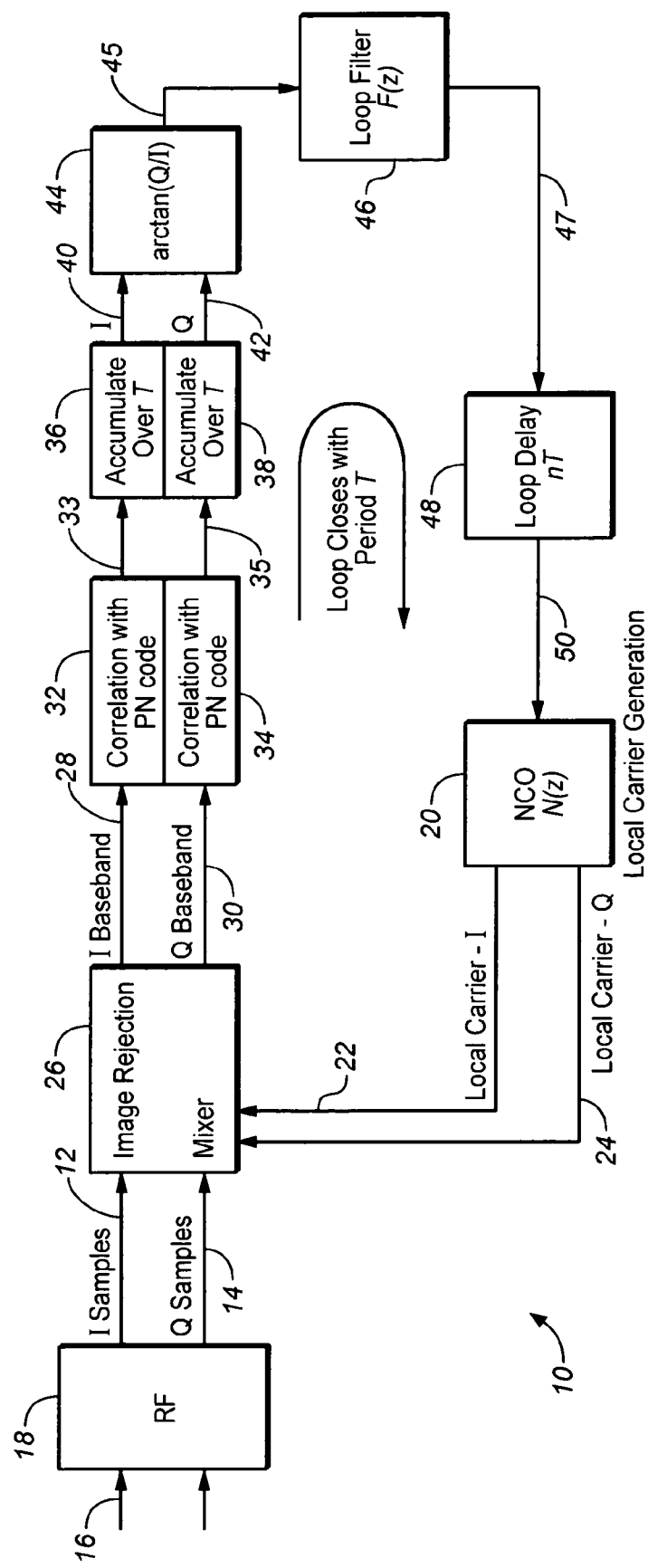
FIG. 1 depicts an apparatus of the present invention for dynamic switching of a plurality of carrier loops in a radio receiver.

In one embodiment, FIG. 1 depicts an apparatus 10 of the present invention for dynamic switching of a plurality of carrier loops in a radio receiver. Code tracking is inherently more robust (than carrier tracking) to signal dynamics. Therefore, an apparatus 10 uses the standard prior art code tracking functionality (not shown).

The input radio signal 16 is sampled in in-phase (I) 12 and quadrature-phase (Q) 14 components by the RF part 18 of the apparatus 10. In one embodiment of the present invention, the radio receiver is configured to track a radio source of the received radio signal, wherein the radio source is selected from the group consisting of: {a GPS satellite; a GLONASS satellite; a GALILEO satellite; and a pseudolite}.

Global Navigational Satellite System (GNSS) is a general term of art comprising GPS, or GLONASS, or GALILEO, or any combination of GPS, GLONASS and GALILEO systems.

The Global Positioning System (GPS) is a system of satellite signal transmitters that transmits information from which an observer's present location and/or the time of observation can be determined. Another satellite-based navigation system is called the Global Orbiting Navigational System (GLONASS), which can operate as an alternative or supplemental system.

The GPS was developed by the United States Department of Defense (DOD) under its NAVSTAR satellite program. A fully operational GPS includes more than 24 Earth orbiting satellites approximately uniformly dispersed around six circular orbits with four satellites each, the orbits being inclined at an angle of 55° relative to the equator and being separated from each other by multiples of 60° longitude. The orbits have radii of 26,560 kilometers and are approximately circular. The orbits are non-geosynchronous, with 0.5 sidereal day (11.967 hours) orbital time intervals, so that the satellites move with time relative to the Earth below. Generally, four or more GPS satellites will be visible from most points on the Earth's surface, which can be used to determine an observer's position anywhere on the Earth's surface. Each satellite carries a cesium or rubidium atomic clock to provide timing information for the signals transmitted by the satellites. An internal clock correction is provided for each satellite clock.

Each GPS satellite continuously transmits two spread spectrum, L-band carrier signals: an L1 signal having a frequency $f1=1575.42$ MHz (approximately nineteen centimeter carrier wavelength) and an L2 signal having a frequency $f2=1227.6$ MHz (approximately twenty-four centimeter carrier wavelength). These two frequencies are integral multiplies $f1=1,540\ f0$ and $f2=1,200\ f0$ of a base frequency $f0=1.023$ MHz. The L1 signal from each satellite is binary phase shift key (BPSK) modulated by two pseudo-random noise (PRN) codes in phase quadrature, designated as the C/A-code and P-code. The L2 signal from each satellite is BPSK modulated by only the P-code. The nature of these PRN codes and accepted methods for generating the C/A-code and P-code are set forth in the document ICD-GPS-200: GPS Interface Control Document, ARINC Research, 1997, GPS Joint Program Office, which is incorporated by reference herein.

The GPS satellite bit stream includes navigational information on the ephemeris of the transmitting GPS satellite (which includes orbital information about the transmitting satellite within next several hours of transmission) and an almanac for all GPS satellites (which includes a less detailed orbital information about all satellites). The transmitted satellite information also includes parameters providing corrections for ionospheric signal propagation delays (suitable for frequency receivers) and for an offset time between satellite clock time and true GPS time. The navigational information is transmitted at a rate of 50 Baud.

A second satellite-based navigation system is the Global Orbiting Navigation Satellite System (GLONASS), placed in orbit by the former Soviet Union and now maintained by the Russian Republic. GLONASS uses 24 satellites, distributed approximately uniformly in three orbital planes of eight satellites each. Each orbital plane has a nominal inclination of 64.80 relative to the equator, and the three orbital planes are separated from each other by multiples of 120° longitude. The GLONASS satellites have circular orbits with a radii of about 25,510 kilometers and a satellite period of revolution of 8/17 of a sidereal day (11.26 hours). A GLONASS satellite and a GPS satellite will thus complete 17 and 16 revolutions, respectively, around the Earth every 8 days. The GLONASS system uses two carrier signals L1 and L2 with frequencies of $f1=(1.602+9k/16)$ GHz and $f2=(1.246+7k/16)$ GHz, where $k=(1, 2, \ldots 24)$ is the channel or satellite number. These frequencies lie in two bands at 1.597-1.617 GHz (L1) and 1,240-1,260 GHz (L2). The L1 signal is modulated by a C/A-code (chip rate=0.511 MHz) and by a P-code (chip rate =5.11 MHz). The L2 signal is presently modulated only by the P-code. The GLONASS satellites also transmit navigational data at a rate of 50 Baud. Because the channel frequencies are distinguishable from each other, the P-code is the same, and the C/A-code is the same, for each satellite. The methods for receiving and demodulating the GLONASS signals are similar to the methods used for the GPS signals.

As disclosed in the European Commission "White Paper on European transport policy for 2010", the European Union will develop an independent satellite navigation system Galileo as a part of a global navigation satellite infrastructure (GNSS).

The GALILEO system is based on a constellation of 30 satellites and ground stations providing information concerning the positioning of users in many sectors such as transport (vehicle location, route searching, speed control, guidance systems, etc.), social services (e.g. aid for the disabled or elderly), the justice system and customs services (location of suspects, border controls), public works (geographical information systems), search and rescue systems, or leisure (direction-finding at sea or in the mountains, etc.).

GALILEO will offer several service levels, from open access to restricted access of various levels:

(A) An open, free basic service, mainly involving applications for the general public and services of general interest. This service is comparable to that provided by civil GPS, which is free of cost for these applications, but with improved quality and reliability.

(B) A commercial service facilitating the development of professional applications and offering enhanced performance compared with the basic service, particularly in terms of service guarantee.

(C) A "vital" service (Safety of Life Service) of a very high quality and integrity for safety-critical applications, such as aviation and shipping. A search and rescue service will greatly improve existing relief and rescue services.

(D) A public regulated service (PRS), encrypted and resistant to jamming and interference, reserved principally for the public authorities responsible for civil protection, national security and law enforcement which demand a high level of continuity. It will enable secured applications to be developed in the European Union, and could prove in particular to be an important tool in improving the instruments used by the European Union to combat illegal exports and illegal immigration.

The real needs of future GALILEO users need to be identified before the characteristics of the package of services can be decided. Studies have already been carried out in various standardization institutes and international bodies, such as the International Civil Aviation Organization, the International Maritime Organization, etc.

The range of GALILEO services is designed to meet practical objectives and expectations, from improving the coverage of open-access services in urban environments (to cover 95% of urban districts compared with the 50% currently covered by GPS alone) which will benefit the 160 million private vehicles in Europe, or enabling the use of satellite navigation applications "indoors", in buildings and even in tunnels, or indeed mobile telephone services based on identifying the caller's position.

Reference to a RADPS herein refers to a Global Positioning System, to a Global Orbiting Navigation System, to GALILEO System, and to any other compatible Global Navigational Satellite System (GNSS) satellite-based system that provides information by which an observer's position and the time of observation can be determined, all of which meet the requirements of the present invention, and to a ground based radio positioning system such as a system comprising of one or more pseudolite transmitters.

After the RADPS receiver determines the coordinates of the i-th RADPS satellite by demodulating the transmitted ephemeris parameters, the RADPS receiver can obtain the solution of the set of the simultaneous equations for its unknown coordinates ($x_0$, $y_0$, $z_0$) and for unknown time bias error (cb). The RADPS receiver can also determine velocity of a moving platform.

A pseudolite comprises a ground based radio positioning system working in any radio frequency including but not limited to the GPS frequencies and the ISM (industrial scientific medical) unlicensed operation band, including 900 MHZ, 2.4 GHz, or 5.8 GHz bands ISM bands, or in a radio location band such as the (9.5-10) GHz band. Pseudolites can be used for enhancing the GPS by providing increased accuracy, integrity, and availability.

The complete description of the pseudolite transmitters in GPS band can be found in "Global Positioning System: Theory and Applications; Volume II", edited by Bradford W. Parkinson and James J. Spilker Jr., and published in Volume 164 in "PROGRESS IN ASTRONAUTICS AND AERONAUTICS", by American Institute of Aeronautic and Astronautics, Inc., in 1966.

The following discussion is focused on a GPS receiver, though the same approach can be used for a GLONASS receiver, for a GPS/GLONASS combined receiver, GALILEO receiver, or any other RADPS receiver.

Referring still to FIG. 1, I 22 and Q 24 components of a local copy of the GPS carrier (the local copy refers to a signal generated internally within the GPS receiver) are generated by the NCO 20 and used to mix I 12 and Q 14 samples down to baseband (zero Hertz) in the Image Rejection Mixer 24.

The apparatus 10 (of FIG. 1) of the present invention employs a Phase-Locked Loop to align I 22 and Q 24 components of a local carrier generated by NCO 20 with I 12 and Q 14 components of the received carrier. As the local carrier and the received carrier are aligned when successfully phase-locked, measuring the phase of the local carrier will also provide the phase of the received carrier. Phase tracking is a requirement for RTK.

More specifically, referring still to FIG. 1, in one embodiment of the present invention, the apparatus 10 comprises Image Rejection Mixer 26 configured to perform a standard quadrature mixing operation of I 12 and Q 14 samples of the received radio signal 16 with I 22 and Q 24 components of the local carrier replica generated by the carrier NCO 20 to generate I 28 and Q 30 baseband samples.

In one embodiment of the present invention, the apparatus 10 further comprises I correlator 32 configured to correlate I baseband sample 28 with a local copy of a code signal aligned to the received radio signal to generate I correlated signal 33, and Q correlator 34 configured to correlate Q baseband sample 30 with a local copy of a code signal aligned to the received radio signal to generate Q correlated signal 35.

More specifically, the phase error between the received and local carrier can be obtained from the correlation of the known PN code for a given satellite with I 28 and Q 30 baseband signals. The code tracking loop, not shown, handles alignment between the received and local copies of the PN codes. The simple mathematical identity is as follows:

$$I_{baseband} = A \cdot \cos(\omega t + \phi) \qquad (\text{Eq. 1})$$

$$Q_{baseband} = A \cdot \sin(\omega t + \phi) \qquad (\text{Eq. 2})$$

where A is the signal amplitude, ω is frequency of the tracking error signal, and φ is the phase of the tracking error signal.

Referring still to FIG. 1, in one embodiment of the present invention, the apparatus 10 further comprises: I accumulator 36 configured to accumulate I correlated signal 33 over a period of time T, and Q accumulator 38 configured to accumulate Q correlated signal 35 over the same period of time T.

In one embodiment of the present invention, the apparatus 10 further comprises arctan (Q/I) means 44 configured to compute a raw carrier tracking error signal 45 by using I 40 and Q 42 accumulated signals. Assuming that the frequency error is zero, the phase error is given by:

$$\varphi = \arctan(Q_{baseband}/I_{baseband}). \quad \text{(Eq. 3)}$$

According to (Eq. 3), the minimum phase error (zero) is achieved if the carrier tracking places all of the signal energy in the I-phase baseband samples.

Referring still to FIG. 1, in one embodiment of the present invention, the apparatus 10 further comprises a loop filter 46 configured to filter the raw carrier tracking error (phase error) 45 signal to obtain a filtered carrier tracking error signal 47.

In one embodiment of the present invention, the apparatus 10 further comprises a loop delay block 48 configured to insert a loop delay $\tau$ into the filtered carrier tracking error signal 47 to generate a feedback error signal 50. The loop delay $\tau$ represents latency of the carrier tracking loop.

The feedback error signal 50 is used to update the digital NCO 20 that generates the local carrier copy that is phase-locked to the receiver carrier signal.

During the normal tracking operation, the code correlation is accumulated over 20 ms, one GPS data bit. The carrier tracking error and carrier NCO are also updated at this rate. The longer accumulation is not possible without first removing the data bits. The shorter accumulation is possible but with the penalty of a reduced energy in the error signal 45 generated by the arctan(Q/I) block 44 thus making the tracking loop more susceptible to noise and thereby limiting the signals that can be tracked.

Under static conditions, the 20 ms accumulation is perfectly adequate. However, when under dynamics the received carrier is changing much faster than it can be detected and accounted for by the phase-locked loop. With respect to the local carrier, the received signal is seen to rotate energy around I and Q baseband samples. The result is that the computation performed by the arctan(Q/I) block 44 becomes very noisy and can cause poor signal tracking and even signal unlocking.

One technique to handle the increased dynamics is to use a shorter accumulation period. The shorter accumulation period allows for a faster loop update rate, for a quicker reaction to the dynamics and for a lesser effective rotation of I and Q baseband samples within the accumulation period. This is the approach used in the current invention.

The shortest accumulation period that can be easily achieved for GPS is 1 ms which is a C/A code period. The carrier tracking loop having 1 ms accumulation period provides updates 20 times faster than the standard carrier tracking loop having 20 ms accumulation period. However, if the carrier tracking is performed by using the carrier tracking loop having 1 ms accumulation period, the signal to noise ratio (SNR) is 20 times lower compared with the SNR resulted from the carrier tracking performed by using the carrier tracking loop having 20 ms accumulation period. This is a 13 dB loss. Thus, the carrier tracking is performed by using the carrier tracking loop having 1 ms accumulation period results in noisier measurements and an increase in the lower CNR (SNR normalized to 1 Hz bandwidth) boundary of signals that can be tracked compared with the carrier tracking performed by using the carrier tracking loop having 20 ms accumulation period.

To overcome this limitation, in one embodiment of the present invention, the apparatus 10 employs three independent carrier tracking loops, each with a different accumulation period.

In one embodiment of the present invention, the three carrier tracking loops are: (A) 1 ms loop; (B) 5 ms loop; and (C) 10 ms loop. The 1 ms loop has the best dynamic performance but requires high SNR to operate. The 5 ms loop provides a good dynamic performance and requires moderate SNR to operate. The 10 ms loop has the lower dynamic performance but can operate even on low SNR signals Only one of the loops is operating at any one time for a given signal. The software dynamically switches between the loops based on changes in the received CNR.

Figure 2:
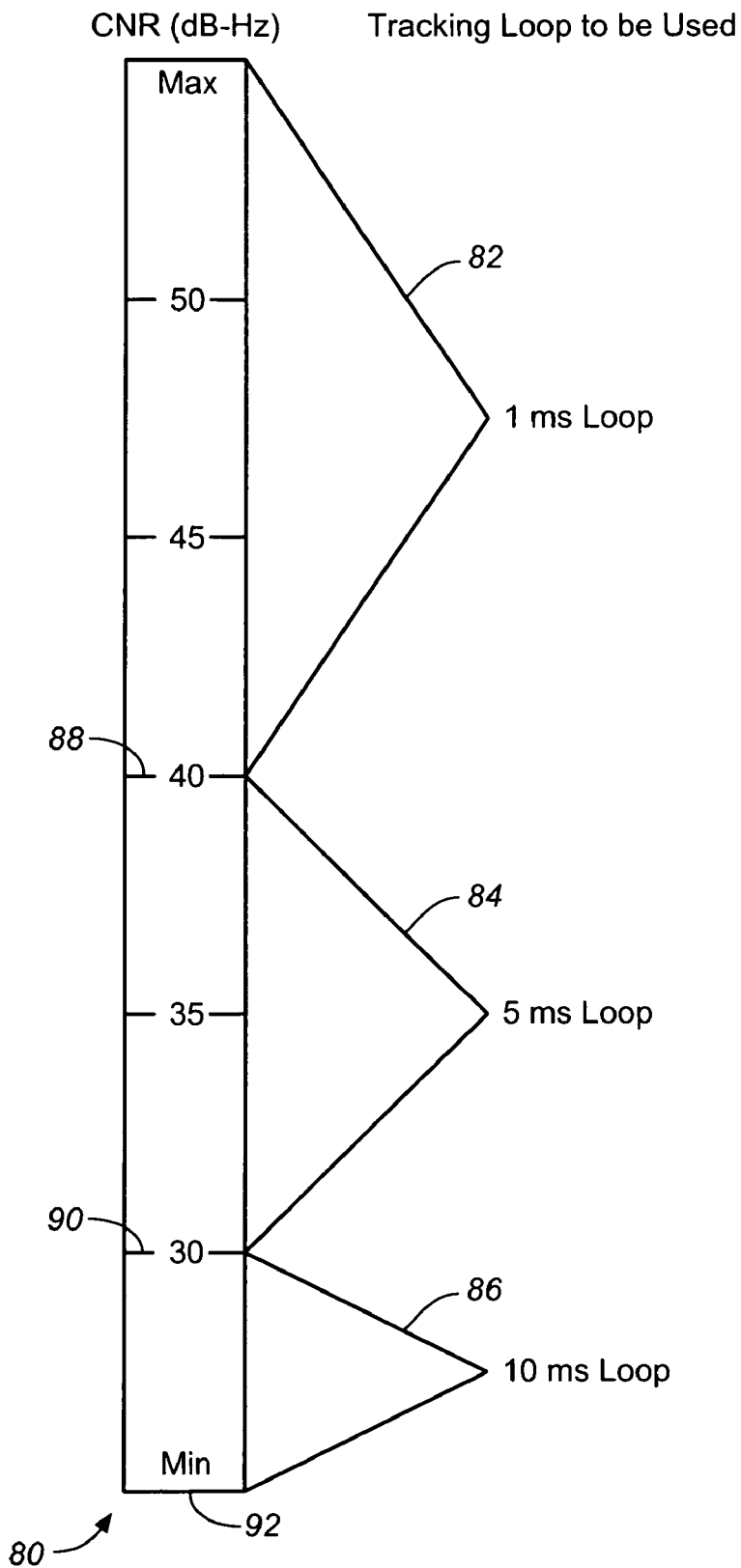
FIG. 2 illustrates theoretical switching thresholds between 1 ms loop, 5 ms loop, and 10 ms, and minimum CNR for 10 ms tracking loop for the purposes of the present invention.

As shown in FIG. 2, the theoretical switching thresholds are approximately as follows: the 88 CNR threshold 40 dB between 1 ms loop 82 and 5 ms loop 84; the 90 CNR threshold 35 dB between 5 ms loop 84 and 10 ms loop 86; and the 92 CNR lower boundary 30 dB of the signal to be tracked by the 10 ms tracking loop 86.

In one embodiment of the present invention, the tracking loop to be used for the next accumulation is selected based on the most recent estimated CNR. Switching between loops is performed as needed.

However, the theoretical thresholds 88, 90, and 92 of FIG. 2 cannot be used in practice due to the fact that the dynamics causes extra noise that has to be estimated during the tracking process itself. For example, the thresholds for the MS980 implement are greater than the theoretical thresholds 88, 90, and 92 by 3 to 4 dB.

The theoretical thresholds 88, 90, and 92 of FIG. 2 also include a 2 dB hysteresis built into the thresholds. Therefore, for a presently used loop to be upgraded to a tracking loop with a shorter period, the CNR must be 2 dB higher than that CNR needed to downgrade the presently used loop to a tracking loop with a longer period. This is done to prevent the loops from rapidly switching when the CNR approaches one of the thresholds.

The apparatus 10 (of FIG. 1) of the present invention should switch between different loops smoothly without significant transients. Indeed, transients can cause cycle slips (resulting in removing of the satellite for which tracking slips from the RTK solution for a while thus requires extra processing to 'fix' back into the solution again), can cause loss of data, or can cause the tracking to unlock.

In one embodiment of the present invention, the apparatus 10 (of FIG. 1) switches between different loops smoothly without significant transients by using the 1 ms accumulation blocks 36 and 38 implemented in hardware, and by implementing the accumulation over 5 ms and 10 ms needed for the other loops in software.

In one embodiment of the present invention, the apparatus 10 (of FIG. 1) includes a loop delay block 48 coupled to the loop filter output 47. The loop delay block 48 updates the NCO 20. The loop delay $\tau$ is needed to account for latency in reading the accumulator outputs into software and for the time taken by the arctan(Q/I) block 44 and by the loop filter 46 to perform necessary calculations.

The loop delay block 48 forms part of the closed-loop transfer function of the phase-locked loop of the apparatus 10 of FIG. 1. If the delay is allowed to vary uncontrolled with time or between tracking channels then each tracking loop would exhibit undesired, different, and unmodelled behavior. Thus, to control this delay term is critical for the functioning of the apparatus 10 (of FIG. 1) of the present invention. Indeed, control of the delay term allows switching between different tracking loops with minimal transients.

The GPS tracking software is normally controlled so that the loop delay $\tau$ is of a fixed period.

In one embodiment of the present invention, the loop delay τ is normalized to values of T, equal to the accumulation period (and update period) of the tracking loop.

Software limitations mean that the smallest loop delay for the 1 ms loop is 1 ms. The optimum loop delay of 5 ms should be used for the 5 ms loop, and the optimum loop delay of 10 ms should be used for the 10 ms loop. The usage of a common normalized loop delay T for all three loops (T=1 ms for 1 ms loop; T=5 ms for 5 ms loop; and T=10 ms for 10 ms loop) would result in the similar closed-loop Z-domain representations for all three tracking loops. The similarity of closed-loop Z-domain representations for all three tracking loops results in the smooth switching between loops with minimum transients. Another similarity requirement in the loops design is that the closed-loop bandwidth needs to be the same for each loop.

On the other hand, using the same 1 ms loop delay for all three loops would result in a faster loop update for all loops and would achieve slightly better dynamic performance for 5 ms and 10 ms loops. However, the difference in loop delays (T for 1 ms loop, T/5 for 5 ms and T/10 for 10 ms) in terms of their Z-domain representations can result in significant transients when a loop switch is performed.

Referring still to FIG. 1, in one embodiment of the present invention, the loop filter 46 is implemented by using is a standard third-order digital filter. It can be represented as follows:

$$H(z)=(a_2.z^{-2}+a_1.z^{-1}+a_0)/(b_2.z^{-2}+b_1.z^{-1}+b_0);\qquad\text{(Eq. 4)}$$

where $a_x$ and $b_x$ terms are the loop coefficients.

The numerator contains a memory of the previous carrier tracking errors. The denominator contains a memory of the previous loop outputs (the values used to update the carrier NCO). Whenever a new CNR value is calculated the tracking software selects the optimum tracking loop which has the shortest period for the given CNR. The selected loop is used the next time the loop closes.

If the loop selected is different from the loop currently used, then the tracking software should perform extra tasks to switch between loops with minimum transients. This basically requires two operations: (1) the numerator terms are reset to zero thereby clearing the filter memory of previous phase errors; (2) the denominator terms are all set equal to the last value output by the filter, thereby clearing the filter memory of previous outputs while maintaining the best current estimate of the signal frequency needed to maintain phase-lock. These two operations are performed at all loop switches. The switching can be performed from any of the three loops to any of the other loops. Loop switches can occur at any time, as the CNR changes, with the exception of a short period directly after each switch to allow the new loop to settle.

One aspect of the present invention is directed to a method of dynamic switching of a plurality of carrier loops in a radio receiver In one embodiment, the method of the present invention comprises the following steps (not shown): (A) receiving a radio signal from a radio source by using a carrier tracking loop; (B) substantially continuously estimating a signal-to-noise ratio (SNR) of the received radio signal from the radio source; (C) if the signal-to-noise ratio (SNR) of the received radio signal from the radio source is above an initial predetermined threshold, performing carrier tracking of the received carrier signal by an initial carrier tracking loop having an initial accumulation period; and (D) if the signal-to-noise ratio (SNR) of the received radio signal from the radio source falls below the initial predetermined threshold, switching from the initial carrier tracking loop having the initial accumulation period to a subsequent carrier tracking loop having a subsequent accumulation period, and performing carrier tracking of the received carrier signal by the subsequent carrier tracking loop having the subsequent accumulation period. The steps (B-D) are preferably repeated when the dynamics changes.

In one embodiment of the present invention, the step (A) further comprises the step (A1) of tracking the radio source of the received radio signal, wherein the radio source is selected from the group consisting of: {a GPS satellite; a GLONASS satellite; a GALILEO satellite; and a pseudolite}.

In one embodiment of the present invention, the step (B) further comprises the following step: (B1) substantially continuously estimating the signal-to-noise ratio (SNR) of the received radio signal from the radio source; and (B2) selecting the initial carrier tracking loop having the initial accumulation period based on the estimated SNR.

In one embodiment of the present invention, the step (B2) further comprises the following step: (B2, 1) if the estimated SNR is above a first predetermined threshold, selecting a first carrier tracking loop having a first accumulation period to implement the initial carrier tracking loop having the initial accumulation period.

In one embodiment of the present invention, the step (B2) further comprises the following step: (B2, 2) if the estimated SNR falls below the first predetermined threshold but is above a second predetermined threshold, selecting a second carrier tracking loop having a second accumulation period to implement the initial carrier tracking loop having the initial accumulation period.

In one embodiment of the present invention, the step (B2) further comprises the following step: (B2, 3) if the estimated SNR falls below the second predetermined threshold but is above a third predetermined threshold, selecting a third carrier tracking loop having a third accumulation period to implement the initial carrier tracking loop having the initial accumulation period.

In one embodiment of the present invention, the step (C) further comprises the following steps: (C1) performing a standard quadrature mixing operation of I and Q samples of the received radio signal with I and Q components of a local carrier replica generated by a carrier NCO by using an Image Rejection Mixer to generate I and Q baseband samples; (C2) correlating the I and the Q baseband samples with a local copy of a code signal aligned to the received radio signal by a code tracking loop to generate I and Q correlated signals; (C3) accumulating the I and Q correlated signals over a period of time T; (C4) computing a raw carrier tracking error signal by using the I and Q accumulated signals; (C5) filtering the raw carrier tracking error signal by using a loop filter to obtain a filtered carrier tracking error signal; (C6) inserting a loop delay τ into the filtered carrier tracking error signal to generate a feedback error signal; wherein the loop delay τ represents latency of the carrier tracking loop; and (C7) closing the carrier tracking loop by applying the feedback error to an input of the carrier NCO to control a frequency of the local carrier signal.

In one embodiment of the present invention, the step (C6) of inserting the loop delay into the filtered carrier tracking error further comprises the step: (C6, 1) of controlling the loop delay to be a fixed period to minimize transient noise associated with switching between the plurality of carrier tracking loops within a radio channel.

In one embodiment of the present invention, the step (C6) of inserting the loop delay into the filtered carrier tracking error further comprises the step: (C6, 2) of selecting the loop delay from the group consisting of: {a loop update; an accumulation period of the first tracking loop; an accumulation period of the second tracking loop; and an accumulation period of the third tracking loop}.

In one embodiment of the present invention, the step (D) of switching from the initial carrier tracking loop having the initial accumulation period to the subsequent carrier tracking loop having the subsequent accumulation period further comprises the following steps: (D1) modeling the loop filter as a third order, digital filter; wherein a numerator of the third order digital filter contains a memory of the previous carrier tracking errors; and wherein a denominator of the third order digital filter contains a memory of the previous loop outputs used to update the carrier NCO; (D2) estimating the SNR and selecting the subsequent carrier tracking loop based on the estimated SNR; wherein the subsequent carrier tracking loop includes a shortest accumulation period corresponding to the estimated SNR; (D3) checking whether the selected carrier loop is different from a currently used loop; and (D4) if the selected carrier loop is different from the currently used loop, resetting the numerator terms to zero, and setting the denominator terms to be equal to a last value output by the loop filter.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of dynamic switching of a plurality of carrier loops in a radio receiver; wherein each carrier loop comprises a plurality of carrier tracking loops; each carrier tracking loop having a predetermined accumulation period; each of said plurality of carrier tracking loops is configured to track a radio source; said method comprising:
(A) receiving a radio signal from said radio source by using one of said carrier tracking loops;
(B) substantially continuously estimating a signal-to-noise ratio (SNR) of said received radio signal from said radio source;
(C) if said SNR of said received radio signal from said radio source is above an initial predetermined threshold, performing carrier tracking of a received carrier signal by an initial carrier tracking loop having an initial accumulation period;
and
(D) if said SNR of said received radio signal from said radio source falls below said initial predetermined threshold; switching from said initial carrier tracking loop having said initial accumulation period to a subsequent carrier tracking loop having a subsequent accumulation period; and performing carrier tracking of said received carrier signal by said subsequent carrier tracking loop having said subsequent accumulation period.

2. The method of claim 1, wherein said step (A) comprises:
(A1) tracking said radio source of said received radio signal, wherein said radio source is selected from the group consisting of:
a GPS satellite; a GLONASS satellite; a GALILEO satellite; and a pseudolite.

3. The method of claim 1, wherein said step (B) comprises:
(B1) substantially continuously estimating said signal-to-noise ratio (SNR) of said received radio signal from said radio source;
and
(B2) selecting said initial carrier tracking loop having said initial accumulation period based on said estimated SNR.

4. The method of claim 3, wherein said step (B2) comprises:
(B2, 1) if said estimated SNR is above a first predetermined threshold, selecting a first carrier tracking loop having a first accumulation period to implement said initial carrier tracking loop having said initial accumulation period.

5. The method of claim 4, wherein said step (B2) further comprises:
(B2, 2) if said estimated SNR falls below said first predetermined threshold but is above a second predetermined threshold, selecting a second carrier tracking loop having a second accumulation period to implement said first carrier tracking loop having said first accumulation period.

6. The method of claim 5, wherein said step (B2) further comprises:
(B2, 3) if said estimated SNR falls below said second predetermined threshold but is above a third predetermined threshold, selecting a third carrier tracking loop having a third accumulation period to implement said second carrier tracking loop having said second accumulation period.

7. The method of claim 6, wherein said step (C) comprises:
(C1) performing a standard quadrature mixing operation of I and Q samples of said received radio signal with I and Q components of a local carrier replica generated by a carrier NCO by using an Image Rejection Mixer to generate I and Q baseband samples;
(C2) correlating said I and Q baseband samples with a local copy of a code signal aligned to said received radio signal by a code tracking loop to generate I and Q correlated signals;
(C3) accumulating said I and Q correlated signals over a period of time T to generate I and Q accumulated signals;
(C4) computing a raw carrier tracking error signal by using said I and Q accumulated signals;
(C5) filtering said raw carrier tracking error signal by using a loop filter to obtain a filtered carrier tracking error signal;
(C6) inserting a loop delay $\tau$ into said filtered carrier tracking error signal to generate a feedback error signal; wherein said loop delay $\tau$ represents latency of a carrier tracking loop;
and
(C7) closing said carrier tracking loop by applying said feedback error signal to an input of said carrier NCO to control a frequency of said local carrier replica.

8. The method of claim 7, wherein said step (C6) of inserting said loop delay $\tau$ into said filtered carrier tracking error signal comprises:
(C6, 1) controlling said loop delay $\tau$ to be a fixed period.

9. The method of claim 8, wherein said step (C6) of inserting said loop delay $\tau$ to said filtered carrier tracking error further comprises:
(C6, 2) selecting said loop delay $\tau$ from the group consisting of: a loop update; an accumulation period of said first carrier tracking loop; an accumulation period of said second carrier tracking loop; and an accumulation period of said third carrier tracking loop.

10. The method of claim 7, wherein said step (D) of switching from said initial carrier tracking loop having said initial accumulation period to said subsequent carrier tracking loop having said subsequent accumulation period comprises:
  (D1) modeling said loop filter as a third order digital filter; wherein a numerator of said third order digital filter contains a memory of previous carrier tracking errors; and wherein a denominator of said third order digital filter contains a memory of previous loop outputs used to update said carrier NCO;
  (D2) estimating said SNR and selecting said subsequent carrier tracking loop based on said estimated SNR; wherein said subsequent carrier tracking loop includes a shortest accumulation period corresponding to said estimated SNR;
  (D3) checking whether said selected subsequent carrier tracking loop is different from a currently used carrier tracking loop; and
  (D4) if said selected subsequent carrier tracking loop is different from said currently used carrier tracking loop, resetting numerator terms to zero, and setting denominator terms to be equal to a last value output by said loop filter.

11. An apparatus for dynamic switching of a plurality of carrier loops in a radio receiver; wherein each carrier loop comprises a plurality of carrier tracking loops; each carrier tracking loop configured to track a radio source; each said carrier tracking loop having a predetermined accumulation period; said apparatus comprising:
  (A) an RF part configured to receive an input radio signal from said radio source and configured to sample said input radio signal in in-phase (I) and quadrature-phase (Q) components;
  (B) an Image Rejection Mixer configured to perform a standard quadrature mixing operation of sampled I and Q components of said received radio signal with I and Q components of a local carrier replica signal and configured to generate I and Q baseband samples;
  (C) an I correlator configured to correlate said I baseband sample with a local copy of a code signal aligned to said received radio signal to generate an I correlated signal;
  (D) a Q correlator configured to correlate said Q baseband sample with said local copy of said code signal aligned to said received radio signal to generate a Q correlated signal;
  (E) an I accumulator configured to accumulate said I correlated signal over a period of time T and configured to output an I accumulated signal;
  (F) a Q accumulator configured to accumulate said Q correlated signal over said period of time T and configured to output a Q accumulated signal;
  (G) an arctan(Q/I) means for computing a raw carrier tracking error signal by using said I accumulated signal and said Q accumulated signal;
  (H) a loop filter configured to filter said raw carrier tracking error signal and configured to obtain a filtered carrier tracking error signal;
  (I) a loop delay block configured to insert a loop delay $\tau$ into said filtered carrier tracking error signal and configured to generate a feedback error signal;
  (J) a digital NCO configured to generate said local carrier replica signal; wherein said local carrier replica signal is phase-locked to said received carrier signal; and
  (K) a tracking software block configured to reset parameters of said loop filter to select an optimum tracking loop.

12. The apparatus of claim 11, wherein said loop filter comprises:
  a third order digital filter; wherein a numerator of said third order digital filter contains a memory of previous carrier tracking errors; and wherein a denominator of said third order digital filter contains a memory of previous loop outputs used to update said digital NCO.

13. The apparatus of claim 11, wherein said I accumulator configured to accumulate said I correlated signal over said period of time T and configured to output said I accumulated signal, wherein said period of time T is 1 ms.

14. The apparatus of claim 11, wherein said Q accumulator configured to accumulate said Q correlated signal over said period of time T and configured to output said Q accumulated signal, wherein said period of time T is 1 ms.

* * * * *